US006763504B2

(12) United States Patent
Rao et al.

(10) Patent No.: US 6,763,504 B2
(45) Date of Patent: Jul. 13, 2004

(54) METHOD FOR REDUCING RC PARASITICS IN INTERCONNECT NETWORKS OF AN INTEGRATED CIRCUIT

(75) Inventors: Vasant B. Rao, Fishkill, NY (US); Ravichander Ledalla, Beacon, NY (US); Jeffrey P. Soreff, Poughkeepsie, NY (US); Fred L. Yang, Fremont, CA (US)

(73) Assignee: International Business Machines Corporation, Armonk, NY (US)

( * ) Notice: Subject to any disclaimer, the term of this patent is extended or adjusted under 35 U.S.C. 154(b) by 104 days.

(21) Appl. No.: 10/237,328

(22) Filed: Sep. 6, 2002

(65) Prior Publication Data

US 2004/0049746 A1 Mar. 11, 2004

(51) Int. Cl.$^7$ .............................................. G06F 17/50
(52) U.S. Cl. ................................. 716/4; 716/1; 716/5
(58) Field of Search ................................... 716/4, 5, 1

(56) References Cited

U.S. PATENT DOCUMENTS

| | | | | |
|---|---|---|---|---|
| 5,751,593 A | * | 5/1998 | Pullela et al. ................... | 716/6 |
| 5,790,415 A | * | 8/1998 | Pullela et al. ................... | 716/6 |
| 5,875,114 A | * | 2/1999 | Kagatani et al. ............... | 716/6 |
| 6,374,205 B1 | * | 4/2002 | Kuribayashi et al. ......... | 703/14 |

OTHER PUBLICATIONS

Genderen et al., "Reduced RC Models for IC Interconnections with Coupling Capacitances", Mar. 1992, IEEE, 3$^{rd}$ European Conference on Design Automation, Proceedings, pp. 132–136.*

Maffezzoni et al., "Efficient Method for Simulating Time Delay of Distributed Interconnections in VLSI Circuits", Jun. 1999, IEEE Electronic Letters, vol. 35, iss. 12, pp. 976–977.*

Devgan et al., "Realizable Reduction for RC Interconnect Circuits", Nov. 1999, IEEE, ACM international conference on Computer–Aided Design, Digest of Technical Papers, pp. 204–207.*

Ganesh et al., "RC–in RC–out Model Order Reduction Accurate Up to Second Order Moments", Sep. 2001, IEEE, International Conference on Computer Design, Proceedings, pp. 505–506.*

A. J. van Genderen and N. P. van der Meijs, "Extracting Simple but Accurate RC Models for VLSI Interconnect", ISCAS 1988 IEEE, p. 2351–2354.

Bernard N. Sheehan, "TICER: Realizable Reduction of Extracted RC Circuits", 1999 IEEE, p. 200–203.

* cited by examiner

*Primary Examiner*—Vuthe Siek
*Assistant Examiner*—Sun James Lin
(74) *Attorney, Agent, or Firm*—H. Daniel Schnurmann

(57) ABSTRACT

A method for further reducing RC parasitics in an interconnect network following internal node elimination is described. A resistor is initially selected as a candidate for shorting, and it is established whether the accumulated delay error at either end of the resistor is less than a predetermined threshold. This threshold must be a fraction of the time-constant threshold selected by internal node elimination techniques in order to limit the growth of the accumulated delay errors. An important aspect of the invention is the simplicity of the formula used to change the downstream resistor values, namely, the product of the value of the resistor shorted and the ratio of the cumulative downstream capacitances of the two ends of the resistor whose value is being changed. This particular choice of updating the downstream resistor values minimizes the absolute-value of the delay errors at every node due to shorting of the selected resistor. It also preserves the delays at all nodes in the interconnect network apart from the two ends of the resistor selected for shorting.

10 Claims, 10 Drawing Sheets

Figure 5

$R_A = R_B = R_C = R_D = R_E = R_F = R_G = R_H = R_I = R_T = R_X = R_Y = R_Z = 1\Omega$
$C_A = C_B = C_C = C_D = C_E = C_F = C_G = C_H = C_I = 10fF$
$C_S = C_T = C_X = C_Y = C_Z = 1fF$
$\varepsilon_A = \varepsilon_B = \varepsilon_C = \varepsilon_D = \varepsilon_E = \varepsilon_F = \varepsilon_G = \varepsilon_H = \varepsilon_I = \varepsilon_S = \varepsilon_T = \varepsilon_X = \varepsilon_Y = \varepsilon_Z = 0$

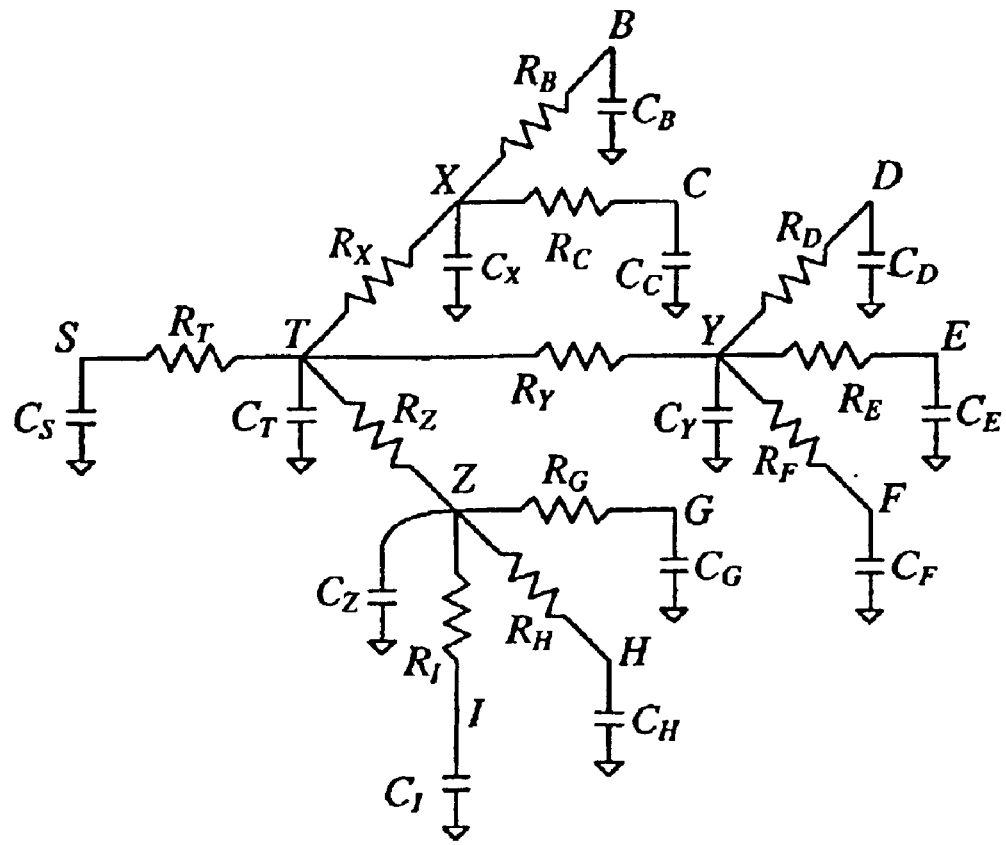

$R_B = R_C = R_D = R_E = R_F = R_G = R_H = R_I = R_T = R_X = R_Y = R_Z = 1\Omega$ $C_B = C_C = C_D = C_E = C_F = C_G = C_H = C_I = 10\text{fF}$ $C_S = C_T = C_Y = C_Z = 1\text{fF}$ $\varepsilon_B = \varepsilon_C = \varepsilon_D = \varepsilon_E = \varepsilon_F = \varepsilon_G = \varepsilon_H = \varepsilon_I = \varepsilon_S = \varepsilon_T = \varepsilon_Y = \varepsilon_Z = 0$ $C_X = 1\text{fF} + 10\text{fF} = 11\text{fF}$ $\varepsilon_X = 1\Omega \times 10\text{fF} = 0.01\text{ps}$

Figure 7

$R_C = R_D = R_E = R_F = R_G = R_H = R_I = R_T = R_X = R_Y = R_Z = 1\Omega$ $C_C = C_D = C_E = C_F = C_G = C_H = C_I = 10fF$ $C_S = C_T = C_Y = C_Z = 1fF$ $\varepsilon_C = \varepsilon_D = \varepsilon_E = \varepsilon_F = \varepsilon_G = \varepsilon_H = \varepsilon_I = \varepsilon_S = \varepsilon_T = \varepsilon_Y = \varepsilon_Z = 0$ $C_X = 11fF + 10fF = 21fF$ $\varepsilon_X = \max(0.01ps, 1\Omega \times 10fF) = 0.01ps$ $R_D = R_E = R_F = R_G = R_H = R_I = R_T = R_X = R_Y = R_Z = 1\Omega$ $C_D = C_E = C_F = C_G = C_H = C_I = 10fF$ $C_S = C_T = C_Y = C_Z = 1fF$ $\varepsilon_D = \varepsilon_E = \varepsilon_F = \varepsilon_G = \varepsilon_H = \varepsilon_I = \varepsilon_S = \varepsilon_T = \varepsilon_Y = \varepsilon_Z = 0$ $C_X = 21fF + 10fF = 31fF$ $\varepsilon_X = \max(0.01ps, 1\Omega \times 10fF) = 0.01ps$ $R_T = R_X = R_Y = R_Z = 1\Omega$
$C_S = C_T = 1fF$
$\varepsilon_S = \varepsilon_T = 0$
$C_X = C_Y = C_Z = 31fF$
$\varepsilon_X = \varepsilon_Y = \varepsilon_Z = 0.01ps$ $R_T = R_Y = R_Z = 1\Omega$
$C_S = 1fF$
$\varepsilon_S = 0$
$C_Y = C_Z = 31fF$
$\varepsilon_Y = \varepsilon_Z = 0.01ps$
$C_T = 1fF + 31fF = 32fF$
$\varepsilon_T = 0.01ps + 1\Omega \times 31fF = 0.041ps$ $R_T = R_Z = 1\Omega$ $C_S = 1\text{fF}$ $\varepsilon_S = 0$ $C_Z = 31\text{fF}$ $\varepsilon_Z = 0.01\text{ps}$ $C_T = 32\text{fF} + 31\text{fF} = 63\text{fF}$ $\varepsilon_T = \max(0.041\text{ps}, 0.01\text{ps} + 1\Omega \times 31\text{fF}) = 0.041\text{ps}$ $R_T = 1\Omega$ $C_S = 1\text{fF}$ $\varepsilon_S = 0$ $C_T = 63\text{fF} + 31\text{fF} = 94\text{fF}$ $\varepsilon_T = \max(0.041\text{ps}, 0.01\text{ps} + 1\Omega \times 31\text{fF}) = 0.041\text{ps}$

Table 1

|  | $\tau_{max}$ (ps) | # of Resistors | # of Nodes | Run-Time (hours) | Stage Delay Error (ps) |
|---|---|---|---|---|---|
| T0 only | 0 | 75,003 | 73,996 | 19.88 | Reference |
|  | 0.1 | 29,502 | 25,960 | 11.02 | -0.06 ~ +0.05 |
|  | 1.0 | 29,493 | 25,951 | 11.03 | -0.06 ~ +0.15 |
|  | 10.0 | 29,491 | 25,949 | 11.03 | -0.06 ~ +0.16 |
|  | 100.0 | 29,491 | 25,949 | 11.05 | -0.06 ~ +0.16 |
|  | 1000.0 | 29,491 | 25,949 | 11.05 | -0.06 ~ +0.16 |
|  | 1000.0* | 41,624 | 22,815 | 14.39 | -0.04 ~ +0.25 |
| T0 - T6 | 0 | 75,003 | 73,996 | 19.88 | Reference |
|  | 0.1 | 26,472 | 23,507 | 9.03 | -0.44 ~ +0.22 |
|  | 1.0 | 18,491 | 16,980 | 5.25 | -0.94 ~ +0.18 |
|  | 10.0 | 1,288 | 4,522 | 2.57 | -2.14 ~ +1.85 |
|  | 100.0 | 138 | 3,509 | 2.42 | -24.3 ~ +2.82 |
|  | 1000.0 | 0 | 3,379 | 2.40 | -24.3 ~ +7.37 |

* Run with fill-in count $\xi = 10$

METHOD FOR REDUCING RC PARASITICS IN INTERCONNECT NETWORKS OF AN INTEGRATED CIRCUIT

FIELD OF THE INVENTION

This invention is related to the field of design automation, and more particularly, to a method for reducing the size of RC parasitics of interconnect networks in an integrated circuit (IC) in order to reduce circuit analysis time.

BACKGROUND OF THE INVENTION

During final timing verification of integrated circuits (ICs), it is crucial to rigorously account for all the RC parasitics in the interconnect networks that link the various transistors in the IC, a known cause of significant delays in the interconnects. Emerging newer and more complex technologies continue to shrink feature sizes, leading to increasing the dominance of the interconnect delays. At present, a circuit extraction tool is used to generate these RC parasitics from a description of the layout of the interconnect. Unfortunately, this creates extremely large RC networks with a wide range of dynamic time constants that can choke downstream detailed circuit analysis tools in the following manner: (1) the size of RC networks is very large, resulting in a significant increase in run-time due to the large size of the circuit matrices; and (2) the wide range of dynamic time constants causes the analysis tools to take extremely small numerical time-steps, resulting in a further increase in the run-time.

Thus, a rigorous accounting of metal R and C is highly advantageous, particularly in deep sub-micron technologies, because of the large delays attributable to these interconnects. It is also desirable to reduce (or crunch down) the large RC networks generated by circuit extraction tools by reducing the size and narrowing the range of dynamic time constants. It should be noted that the run-time advantage of crunching resistor networks in a more compact form applies at each time step of each simulation performed by the detailed circuit analysis tool. This is highly significant because each of these simulations are typically run multiple times during circuit optimization, and the same compressed RC network continues to be reused for all the iterations.

An integrated circuit can be represented by a collection of transistors with the terminals interconnected by nets. After completing the layout, each net is electrically modeled as an RC network of nodes and elements. The elements of the network are resistors (Rs) and capacitors (Cs). Nodes connecting transistor terminals are referred to boundary nodes, while the remaining ones are referred to as internal nodes of the RC network.

Prior art techniques select only internal nodes for elimination based on its nodal time constant defined by:

$$\tau = \frac{C}{\gamma} \quad (1)$$

where C is the grounded capacitance of the node and $\gamma$ is the total conductance (i.e., the inverse of the resistance) connected to the node. For example, for node X shown in FIG. 1, the grounded capacitance and the total conductance are given by:

$$C = C_X \quad (2)$$

$$\gamma = G_1 + G_2 + G_3 + G_4 \quad (3)$$

Prior art techniques eliminate an internal node when its nodal time constant $\tau$ is smaller than a predetermined threshold $\tau_{max}$. When a node is selected for elimination, the grounded capacitance of the node and all the resistors connected to the node are distributed to neighboring nodes using the following formula:

$$C_i = C_X \frac{G_i}{\gamma} \quad (4)$$

$$G_{ij} = \frac{G_i G_j}{\gamma} \quad (5)$$

where i and j represent the index of a pair of neighboring nodes of the node X being eliminated, $C_i$ is the additional capacitance to be added to the existing grounded capacitance at node i, and $G_{ij}$ is a (possibly new) conductance introduced between nodes i and j. FIG. 2 is an illustration of the node elimination process for node X in the example given in FIG. 1.

The total capacitance of the RC network remains the same after the elimination of an internal node:

$$\sum_i C_i = \frac{C_X}{\gamma} \sum_i G_i = C_X \quad (6)$$

Moreover, it can be shown that the Elmore delays at all boundary nodes are preserved by the elimination process. (Elmore's delay is the first time-moment of the impulse response at a sink. The response at a sink due to an arbitrary input waveform is simply the convolution of the impulse response with the input waveform). This is highly regarded property of the RC reduction process.

Whenever a node is eliminated, the node count is reduced by 1, although the number of resistors may actually increase. For instance, in the example shown in FIG. 2, there are four resistors prior to elimination, but six thereafter. Increasing the total number of resistors is not desirable since the circuit matrices become denser. In general, for a node with k neighbors that already has m resistors among its neighbors, the fill-in count, or the total number of new resistors created after its elimination, is given by:

$$\xi = \frac{k(k-1)}{2} - m - k \quad (7)$$

Internal node elimination is generally restricted to only those nodes that have a fill-in count of 0 or less to preserve the sparsity of the reduced RC network, since the total number of resistors cannot increase.

The problem with conventional techniques is that they apply only to the elimination of internal nodes, and not to boundary nodes of the RC networks. An example of the latter is shown in FIG. 3, where node X is connected to the gate terminal of a transistor external to the RC network. Even if node X had a small ($<\tau_{max}$) time constant, prior art methods would not eliminate it because by eliminating node X, the gate terminal of the transistor shown in FIG. 3 would have to be split up and distributed among the neighboring nodes (1, 2, 3, and 4), resulting in a circuit that is not equivalent to the original one.

In transistor-level static timing analysis, circuits which contain large RC networks with many boundary nodes and a wide range (over seven orders of magnitude) of time constants are routinely encountered. Since algorithms in the prior art only eliminate internal nodes, their quality is limited since there usually remains a large number of boundary nodes with very small time constants (several orders of magnitude less than the Elmore delay).

OBJECT OF THE INVENTION

It is, therefore, an object of the invention to reduce large parasitic RC networks in the interconnect of an integrated circuit design, preferably after having applied internal node elimination techniques (or any other RC reduction technique).

It is another object to speed up the analysis of the resulting RC network without a significant loss of accuracy.

It is another object to provide the user with a smooth size-versus-accuracy tradeoff such that as the accuracy requirement is lowered, the size of the RC network approaches the lower limit of each interconnect having no resistors. The speed of the circuit analysis tools is the fastest at this extreme limit.

SUMMARY OF THE INVENTION

In a first aspect of the invention, there is provided a method for allowing further reduction of parasitic RC networks after applying conventional internal node elimination techniques.

The present inventive method further reduces (beyond only eliminating internal nodes) RC networks by shorting certain resistors connected to the boundary nodes, and adjusting the value of neighboring resistors to compensate for the errors introduced by the shorting. This additional reduction of the RC networks greatly improves the performance of downstream analysis tools, such as circuit simulators, without a significant loss of accuracy.

A resistor is selected as a candidate for shorting if the accumulated delay error at either end is less than a predetermined threshold. This threshold is a fraction (e.g., $\frac{1}{10}$) of the time-constant threshold chosen for the internal node elimination conventional technique in order to limit the growth of the accumulated delay error. After shorting the resistor, the accumulated delay error at the merged node is updated and values of downstream resistors are changed to preserve the delay at downstream nodes. An important aspect of the invention is the simplicity of the formula used to change the downstream resistor value, namely, the product of the value of the resistor shorted and the ratio of the cumulative down stream capacitors of the two ends of the resistor whose value is being changed. This particular choice of updating the downstream resistor values minimizes the absolute-value of the delay errors at every node due to shorting of the selected resistor.

In still another object of the invention, there is provided a method for reducing the size of RC parasitics in an interconnect network of an integrated circuit (IC), the IC being formed as a collection of transistors, each having its terminals interconnected by nets, each of the nets modeled by nodes and elements, the elements modeled as resistors (R) and capacitors (C), the nodes attached to transistor terminals labeled as boundary nodes while the remaining nodes are labeled as internal nodes, the method including the steps of: a) selecting a net from the collection of nets; b) reducing the size of the RC network of the selected net by eliminating the internal nodes having a time-constant below a predetermined threshold and a fill-in count contained within a pre-specified limit; c) iteratively shorting a resistor connected to a boundary node, wherein the accumulated delay error at the boundary node after shorting is less than a fraction of the predetermined threshold; d) updating the values of the resistors adjoining the shorted resistor, wherein no additional delay error is generated in the remaining nodes due to shorting the resistor; and repeating steps c) and d) until no boundary nodes are found in the selected RC network meeting the predetermined threshold.

BRIEF DESCRIPTION OF THE DRAWINGS

The foregoing and other objects, aspects and advantages of the invention will be better understood from the detailed description of a preferred embodiment when taken in conjunction with the following drawings.

FIG. 4 is a schematic diagram that illustrates the reduction of RC parasitics in a interconnect network, in accordance with the present invention, wherein

FIG. 7 through FIG. 13 are respectively schematic diagrams showing the circuit of FIG. 6 after shorting resistor $R_A$ (FIG. 7); after shorting resistor $R_B$ (FIG. 8); after shorting resistor $R_C$ (FIG. 9); after shorting resistor $R_D$, $R_E$, $R_F$, $R_G$, $R_H$, and $R_I$ (FIG. 10); after shorting $R_X$ (FIG. 11); after shorting $R_Y$ (FIG. 12); and after shorting $R_Z$ (FIG. 13).

Table 1 in FIG. 14 shows the performance measurement of the invented algorithm when compared with the algorithm that only eliminates internal nodes.

DETAILED DESCRIPTION OF THE INVENTION

The algorithm of the present invention starts by applying a conventional internal node elimination method to a given RC network with a predefined time-constant threshold and fill-in count limit. Thereafter, all the nodes left in the RC network are either boundary nodes or internal nodes with either time constants or fill-in counts too large to be safely eliminated.

In order to simplify the description of the invention, focus is initially directed to RC networks having no floating capacitors, no grounded resistors, and having a grounded capacitor at each node. It is, furthermore, assumed that the RC network is simply an RC tree structure, which implies that there are no resistive loops within the RC network. Hereinafter, most of these assumptions will be relaxed to extend the applicability of the inventive algorithm to more general RC networks.

What the present method provides to boundary nodes is the ability of further reducing (beyond the process of only eliminating internal nodes) RC networks by shorting selected small resistors connected to the boundary nodes and adjusting the value of neighboring resistors to compensate for the errors introduced by the shorting. (Shorting a resistor implies removing this component and combining or merging its two ends into a single node).

Figure 1:
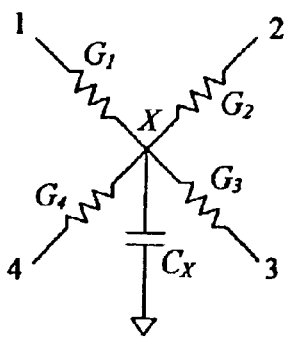
FIG. 1 is a schematic diagram defining a conventional nodal time constant.
Figure 2:
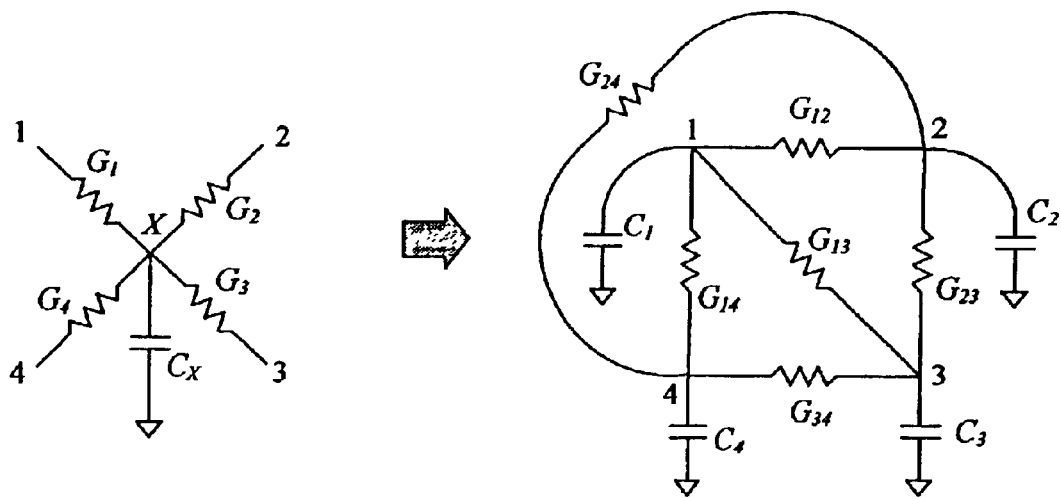
FIG. 2 shows schematically how an internal node is typically eliminated by conventional techniqus.
Figure 3:
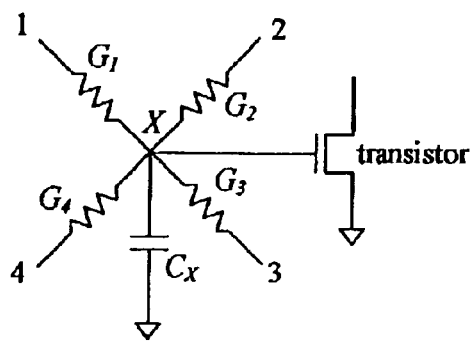
FIG. 3 shows an example of a conventional boundary node.
Figure 4A:
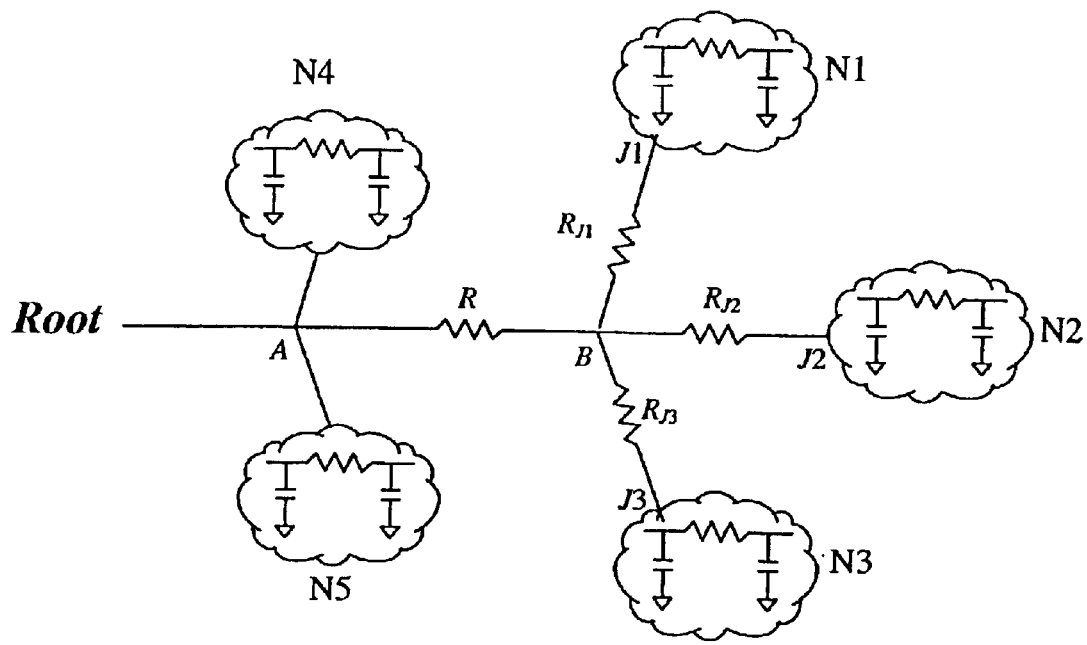
FIG. 4a shows the RC tree before shorting the resistor between A and B, and FIG. 4b showing the RC tree after shorting the same branch.

To analyze the error introduced by shorting a resistor, the RC tree shown in FIG. 4a will first be considered. Initially, a Root node, namely, the source or driver of the RC tree, is designated. By definition, an RC tree is characterized in that there exists a unique path of resistors from the Root node to any other node, e.g., X, in the tree. The node Y adjacent to X on this path will be referred to as the parent. Alternatively, X is a child of Y. A node may have several children, but will always have a unique parent.

Figure 4B:
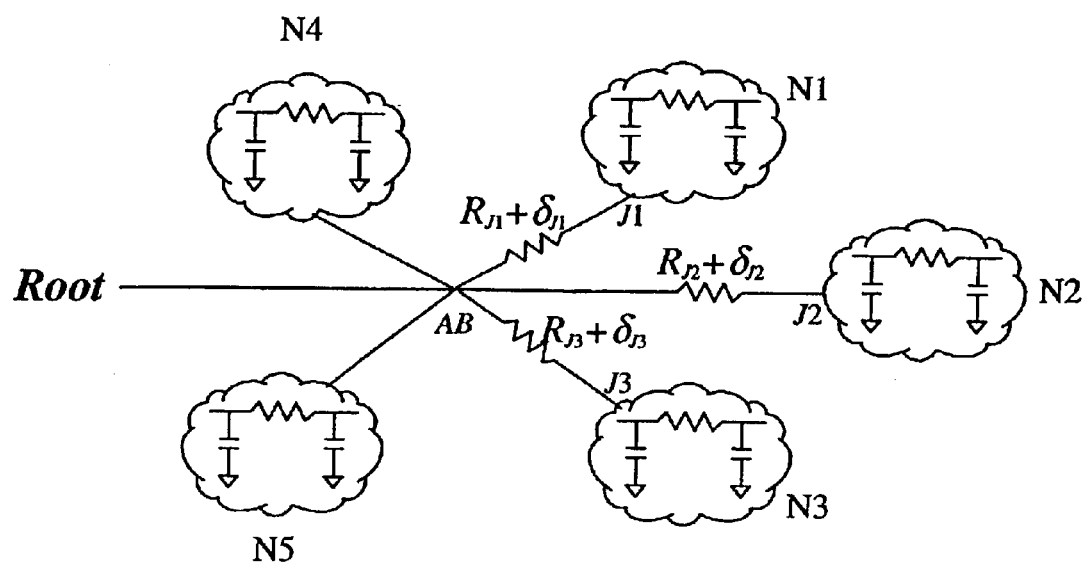

Let $C_X$ denote the grounded capacitance at any arbitrarily selected node X in the tree, and $\underline{C}_X$ represent the cumulative downstream capacitance at node X and all its descendants in the tree (i.e., children, children's children, etc.). Assuming that resistor R between nodes A (parent) and B (child) in the tree shown in FIG. 4a is to be shorted. Also, let J denote any child (there could be several) connected via resistor $R_J$ to B. Node B is shown as having three children, J1, J2, and J3. At each of the neighbors of both A and B, there could an arbitrary number of sub-trees (or sub-networks in general) anchored, as shown by the clouds N1, N2, N3, N4, and N5. After shorting R between A and B, the resulting RC network appears as seen in FIG. 4b. The individual nodes A and B are now merged into a single node AB.

By introducing appropriate changes in value, hereinafter referred to as perturbations $\delta_J$, of the child resistors $R_J$ (there could be several J's), the Elmore delays at all other nodes in the original network illustrated in FIG. 4a apart from node B remain unchanged. To this end, let $D_X$ denote the Elmore delay from the Root in the original tree shown in FIG. 4a to node X, and $D'_X$ denote the Elmore delay from the Root in the new tree to node X (FIG. 4b) after shorting R It is known that the Elmore delay at any node of an RC tree is equal to the Elmore delay at its parent node plus an RC time-constant product of the resistor between the node and its parent times the downstream capacitance at the node. Applying this additive property at nodes B and J in the original tree results in:

$$D_B = D_A + R\underline{C}_B \quad (8)$$

$$D_J = D_B + R_J \underline{C}_J \quad (9)$$

while the new tree after shorting R is:

$$D'_J = D'_{AB} + (R_J + \delta_J)\underline{C}_J \quad (10)$$

The perturbations shown by:

$$\delta_J = R\frac{\underline{C}_B}{\underline{C}_J} \quad (11)$$

for each child J of B satisfies the claim made above that the Elmore delays at all other nodes in the original network illustrated in FIG. 4a apart from node B remain unchanged. Then, the error in Elmore delay incurred by shorting R beomes:

$$\epsilon_{short} = R\underline{C}_B \quad (12)$$

This error occurs only if node B is a boundary node of the original network. No error occurs for a boundary node A. In fact, the above choice of perturbations actually minimizes the error, as seen from the following equation:

$$E = |D'_{AB} - D_A| + |D'_{AB} - D_B| + \sum_{X \neq A,B} |D'_X - D_X| \quad (13)$$

depicting the absolute value of the difference ($L_1$-norm) in the Elmore delays at each node in the two networks (FIGS. 4a and 4b). The main benefit for using the perturbation formula given by Equation 11 in association with shorting resistor R between A and B is that the Elmore delays at nodes J and beyond are preserved, which is not the case with a simple shorting, namely, with no perturbation in $R_J$.

In order to maintain the delay error in check while repeatedly shorting resistors, a running total of the delay error at each node in the RC tree is maintained so that if this accumulated error at a node exceeds a predefined threshold, the resistor from this node to its parent in the tree will not be shorted. Let $\epsilon_X$ denote the total accumulated error in the Elmore delay thus far at any node X in the network. Initially, of course, $\epsilon_X = 0$ for all nodes X After shorting a resistor R initially connected to nodes A and B in the tree, with A being the parent of B, the error is updated to:

$$\epsilon_{AB} = \max(\epsilon_A, \epsilon_B + R\underline{C}_B) \quad (14)$$

where AB is the new merged node after shorting R. Generally, to preserve accuracy in the delay, it is recommend that the threshold for accumulated error be a small fraction $$\left(e.g., \frac{1}{10}\right)$$

of the nodal time constant threshold used for internal node elimination, such that:

$$\varepsilon_{AB} < \frac{1}{10}\tau_{\max} \quad (15)$$

Alternatively, merging of boundary nodes is carried out only if the accumulated error does not exceed, e.g., $$\frac{1}{10},$$

of the threshold $\tau_{max}$, used for internal node elimination.

It can be seen from this derivation that the assumption made earlier for the RC tree is too restrictive. In fact, all that is needed for the RC network is to have a resistor R that satisfies the additive relationships defined by Equations 8 and 9, which will be achieved as long as node B in FIG. 4a is not part of any loop of the network. What is required is to define a tree and a root node to establish a parent/child relationship among the nodes of the network. If the original RC network is not a tree, then the inventive method can be applied to a minimum weighted spanning tree (the resistor values forming the weights) from the source or driving node designated as the root. The reason for the choice of spanning tree is that large valued resistors do not end being shorted. Furthermore, as mentioned earlier, floating or coupling capacitors can be handled since internal node elimination methods in the prior art can eliminate nodes connected to such capacitors. Moreover, their presence does not effect the inventive short-resistor-and-update- children technique. Finally, the Elmore delay was chosen as the delay measure only because it satisfies the additive relationship of the form shown in Equations 8 and 9, and the delay error due to shorting has a simple form of the product of R and C described in Equation 12. Any other delay measure that satisfies the additive relationship of the form shown in Equation 8 is also adequate. However, it may not be easy to derive a simple perturbation formula as that of Equation 11, and it may not be sufficient to only update several children resistors of the one being shorted in order to minimize the delay error incurred.

Figure 5:
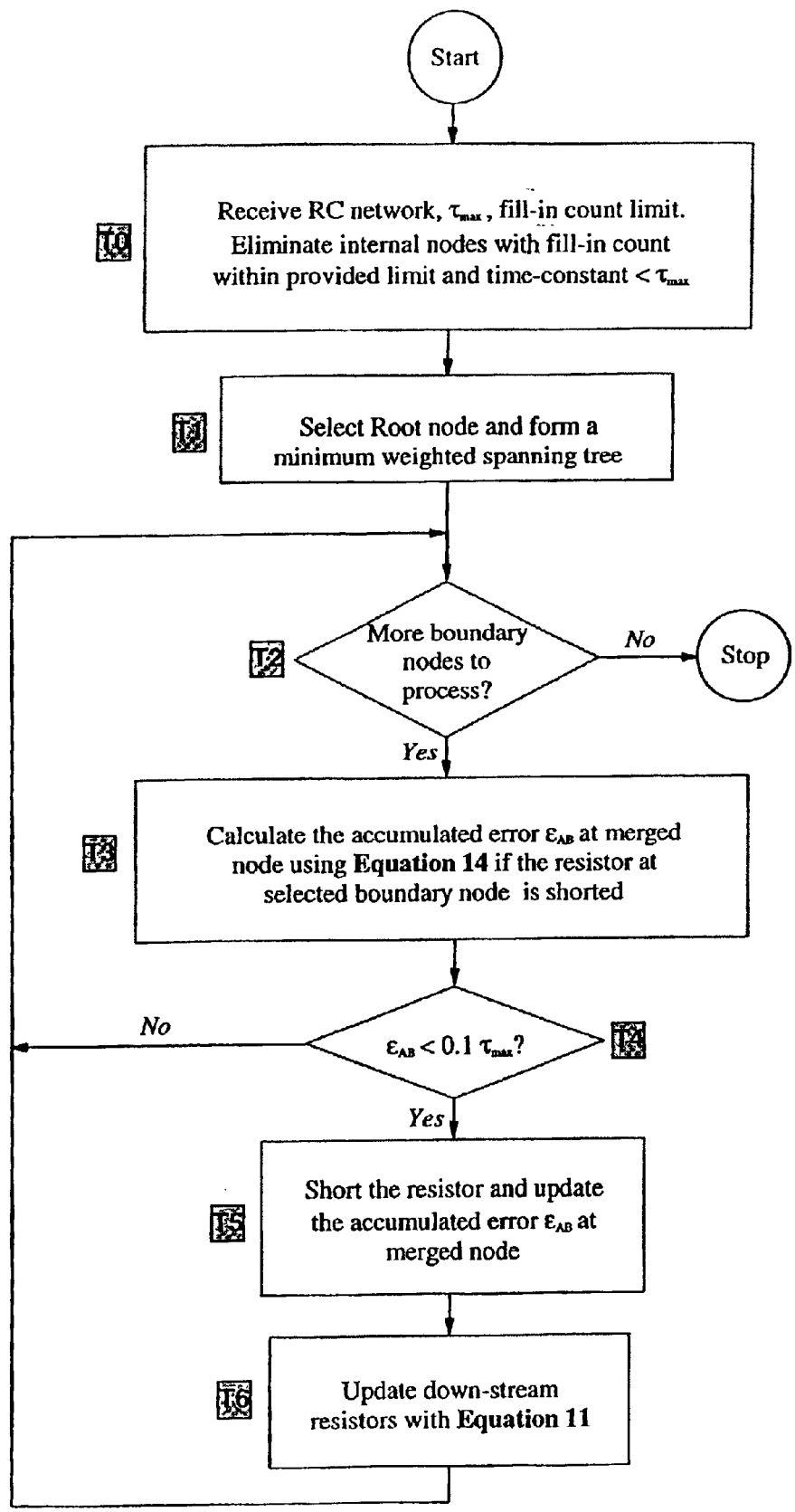
FIG. 5 is a flow chart illustrating the major steps of the RC reduction algorithm, according to the present invention.

To summarize, a step-by-step process for carrying out the invented RC reduction algorithm is given in the flow chart shown in FIG. 5. The processing steps are labeled T0 through T6 for easy reference.

The process begins (Step T0) by providing an RC network, a time-constant threshold $\tau_{max}$ and a fill-in count limit. Then, all internal nodes with fill-in count within a predetermined limit and nodal time-constant $<\tau_{max}$ are eliminated. In Step T1, a boundary node driving the RC network is designated the Root, and a minimum resistive spanning tree is created so that Equations 8 and 9 are satisfied for all resistors within the context of the tree. It algorithm then determines if there exists any boundary node in the RC network that can be processed (Step T2) and, if so, it selects a node in Step T3, and calculates the accumulated error $\epsilon_{AB}$ using Equation 14 if the resistor between the selected node and its parent node is to be shorted. In Step T4, the value of $\epsilon_{AB}$ calculated in the previous step is compared against $\frac{1}{10}\tau_{max}$. If $\epsilon_{AB} \geq \frac{1}{10}\tau_{max}$, the process skips the selected node for processing and returns to Step T2 to select a new boundary node for processing. If $\epsilon_{AB} < \frac{1}{10}\tau_{max}$, the algorithm actually shorts the resistor between the selected node and its parent and updates the value of the accumulated error at the merged node (due to shorting) in Step T5. Next, in Step T6, perturbations are introduced at all neighboring downstream children resistors using Equation 11, which completes the processing of one boundary node in the RC network. The algorithm then returns to Step T2 to select the next node,. And comes to a stop when all boundary nodes in the circuit have been considered. This completes the reduction of a single RC network. The same approach is now applied to another RC network, and so on.

Figure 6:
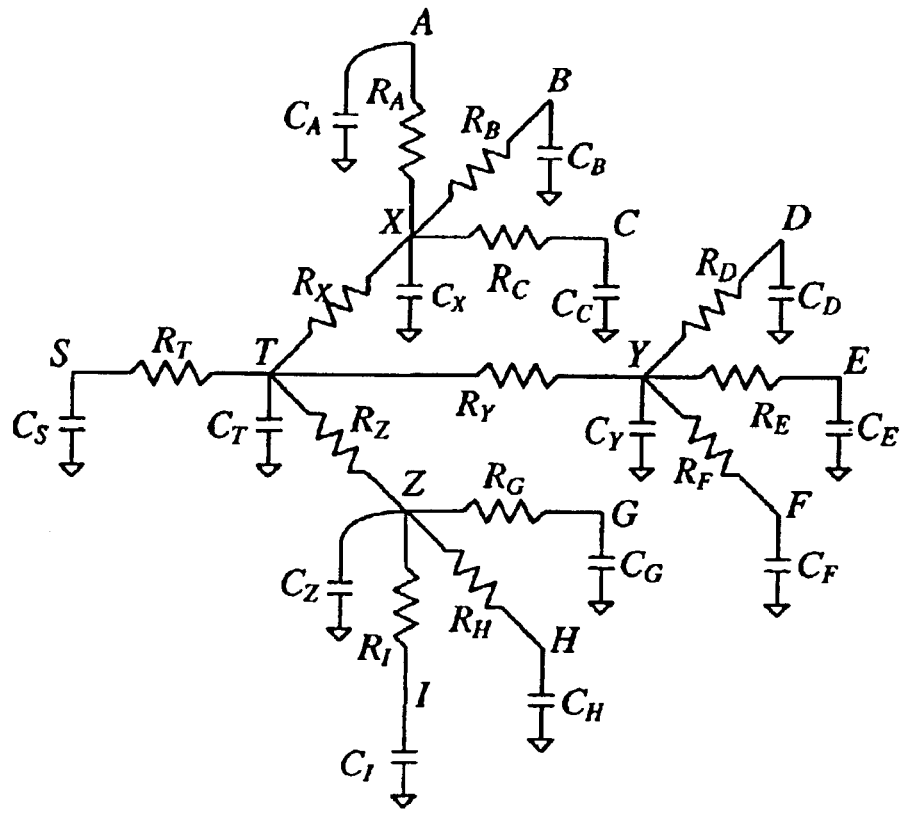
FIG. 6 is a schematic diagram of a sample resistor-capacitor network.

To illustrate how the inventive RC reduction method carried out for an RC network, the circuit in FIG. 6 will now show the transformation of the network during RC reduction. There are 14 nodes in the circuit, namely, A, B, C, D, E, F, G, H, I, S, T, X, Y, and Z. Node S is the source driving the network and is designated the Root. Nodes A, B, C, D, E, F, G, H, and I are boundary nodes, i.e., there is an external connection (transistor terminal) at each of the nodes, (not shown). Assuming that the fill-in count limit is zero, Step T0 cannot eliminate any internal node since each of the four internal nodes X, Y, Z, and T have fill-in count of two, hence, greater than zero. Each resistor in the RC network is assumed to be 1Ω. Each boundary node has a grounded capacitance of 10 fF while each internal node has a grounded capacitance of 1 fF. Since the network of FIG. 6 is already an RC tree, nothing is done in Step T1. Now, it is assumed that the user specifies a time constant threshold $\tau_{max}=0.1$ ps and that the boundary node selection process follows the alphabetical order. Initially, the accumulated error at each node is zero:

$$\epsilon_A=\epsilon_B=\epsilon_C=\epsilon_D=\epsilon_E=\epsilon_F=\epsilon_G=\epsilon_H=\epsilon_I=\epsilon_S=\epsilon_T=\epsilon_X=\epsilon_Y=\epsilon_Z=0$$

Further, for simplicity sake, in the drawings, the merged node obtained by shorting a resistor between a node and its parent will be denoted by the name of parent (without concatenating the names of the two ends of the resistor). The process begins with Step T2, with node A (with parent X) the first node to be selected for processing, and resistor $R_A$, the first resistor selected for shorting.

In Step T3, the algorithm computes $\epsilon_X=1\Omega \times 10$ fF$=0.01$ ps at the merged node X (representing the merge of X and A due to shorting of $R_A$). Since it satisfies Equation 15 (Step T4), shorting of $R_A$ in Step T5 occurs and the accumulated error on node X (representing the merge of X and A due to shorting of $R_A$) is updated. Since there is no downstream child resistor from node A, Step T6 is not activated.

Figure 8:
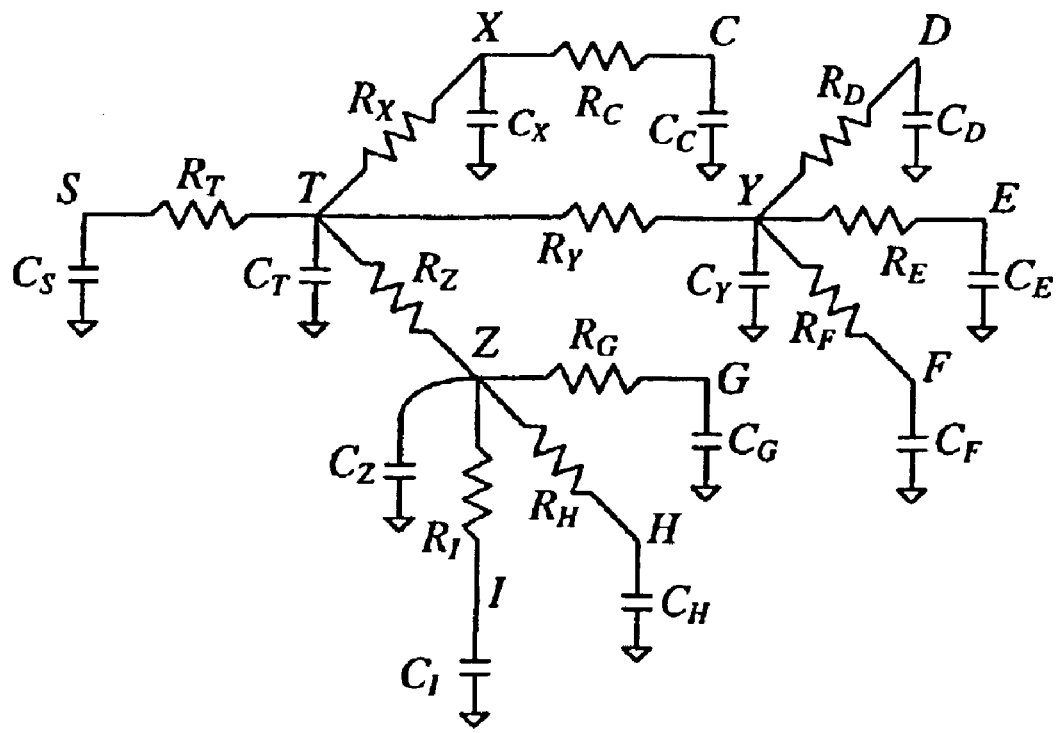

FIG. 7 shows the circuit after shoring $R_A$. The combined capacitance value at node X becomes 11 fF due to shorting of $R_A$. Next, the algorithm selects boundary node B (Step T2) and short $R_B$ in Steps T3, T4, T5, and T6, with the resulting circuit shown in FIG. 8. The grounded capacitor at node B is added to the capacitance value at the parent node X resulting in a total capacitance of 21fF. However, the accumulated error at node X remains at 0.01 ps since the error contribution from shorting $R_B$ is the same as the existing error accumulated on node X and the algorithm takes the maximum between the two values in Equation 14.

Figure 9:
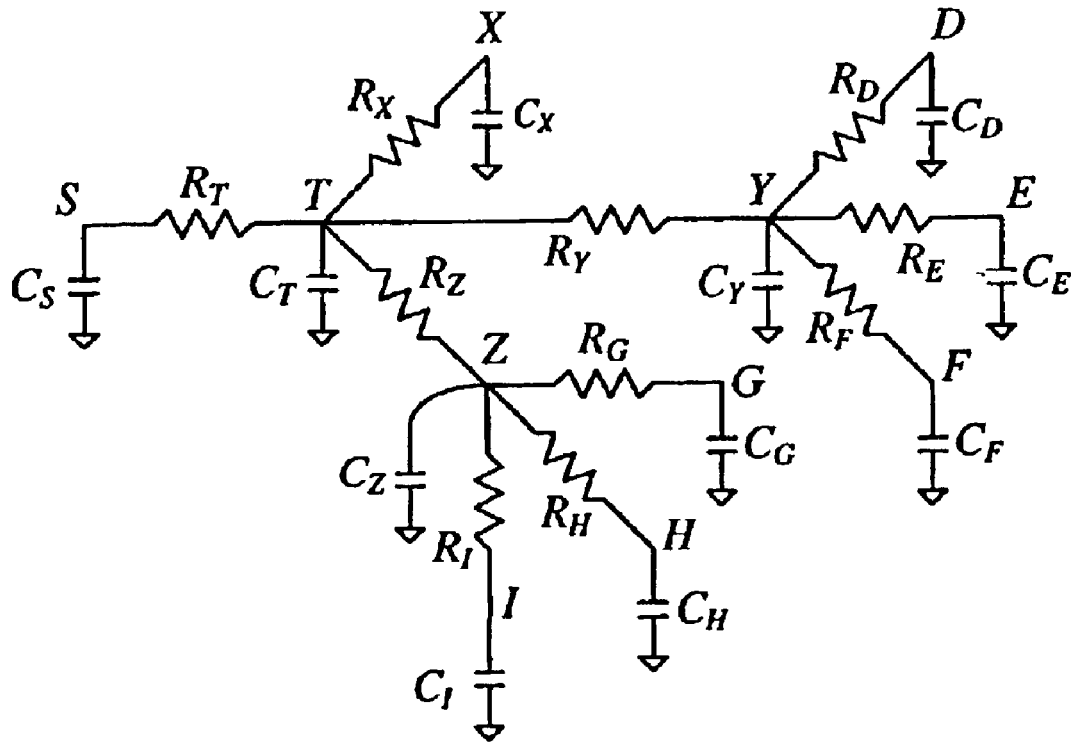
Figure 10:
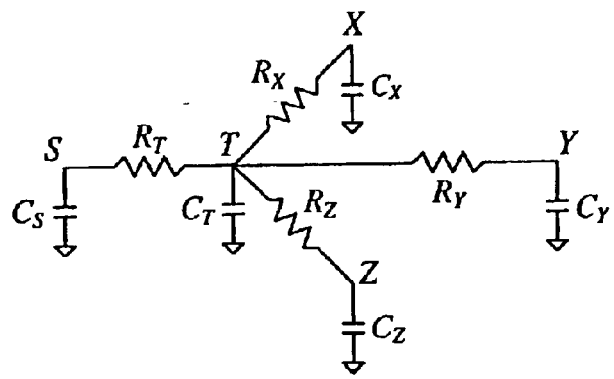

Referring now to FIG. 9, the circuit is shown after selecting node C and shorting $R_C$. The capacitance at node X is once again incremented by the amount of the capacitance at node C and the accumulated error at node X remains unchanged for the same reason as when $R_B$ was shorted. It is evident that what occurs to node Y and node Z when $R_D$, $R_E$, $R_F$, $R_G$, $R_H$, and $R_I$ are shorted is identical to what happened to node X when $R_A$, $R_B$, and $R_C$ were shorted, due to the similarities at nodes X, Y, and Z in terms of their RC interconnections. Therefore, the details of shorting $R_D$, $R_E$, $R_F$, $R_G$, $R_H$, and $R_I$ will not be further described. The resulting circuit is shown in FIG. 10, showing the same grounded capacitance and accumulated error on nodes X, Y and Z.

At this point, nodes X, Y, and Z have become boundary nodes because the external connections (transistor terminals) that were originally attached to nodes A through I are now connected to nodes X, Y, and Z. Therefore, the algorithm shorts resistors $R_X$, $R_Y$, and $R_Z$. However, if $R_X$ is shorted, it will result in an accumulated error of $\epsilon_T=0.041$ ps at node T, as determined by Equation 14, which would violate Equation 15. The same will happen if resistors $R_Y$ or $R_Z$ are to be shorted. Therefore, for the given threshold of $\tau_{max}=0.1$ ps, the algorithm comes to an end.

Figure 11:
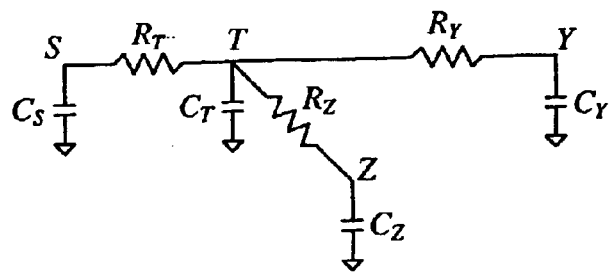
Figure 12:
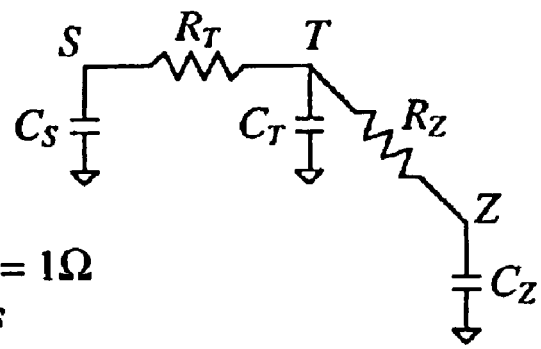
Figure 13:
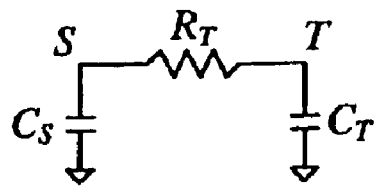

For a user defined threshold of $\tau_{max}=0.5$ ps, the algorithm continues with shorting of $R_X$, $R_Y$, and $R_Z$, and the resulting circuits are shown in FIG. 11, FIG. 12, and FIG. 13, respectively. At this point, the circuit contains only two nodes with one resistor $R_T$ connecting them, and the algorithm terminates because a further shorting of $R_T$ would violate Equation 15 for the given threshold of $\tau_{max}=0.5$ ps. Finally, if the user-defined threshold is chosen to be $\tau_{max} \geq 1.35$ ps, the algorithm will then crunch the circuit down to a simple network with no resistors and a single grounded capacitor, since the accumulated error on node S when $R_T$ is shorted will satisfy Equation 15. This example clearly demonstrates that with the inventive algorithm it is possible to reduce the RC network to one with no resistors if the user had selected a time-constant threshold sufficiently large.

To demonstrate the effectiveness of the invented algorithm on a representative integrated circuit, a macro having 11644 transistors interconnected by way of 3379 nets was chosen. The layout was extracted, resulting in 3379 different RC networks. Summing up the number of resistors and nodes in each of these networks results in a total of 75,003 resistors and 73,996 nodes. A transistor-level static timing tool which performs repeated simulations of the RC networks contained in the circuit was chosen as the analysis tool. As stated earlier, the goal of developing a good RC network reduction algorithm is to achieve efficiency and accuracy. Efficiency is measured by the amount of run-time reduction of the transistor-level static timing analysis, and accuracy is determined by the amount of stage delay error (i.e., the delay of the gate driving the RC interconnect network at the root added to the delay from the root to a boundary (or sink) node of the RC network caused by the reduced RC networks created by the algorithm. The higher the reduction in run-time, the better is the efficiency. Likewise, the smaller the stage delay error, the better is the accuracy.

The measurements resulting from the different values of the user-selected time-constant threshold $\tau_{max}$ are tabulated in Table 1 in FIG. 14. There are two sections in the table. The first section shows the results from running only the internal node elimination Step T0 of the algorithm, and is to be used for comparison purposes. The second section shows the results from running all the steps, from Steps T0 through T6. The run-time of static timing analysis is approximately 20 hours on the original circuit with no RC reduction, as it may be seen from by the data provided for $\tau_{min}=0$ in both data sections.

Assuming the fill-in count limit is zero (to preserve sparsity). As $\tau_{max}$ gradually increases, the RC networks forming part of the circuit are reduced, as indicated by the decreasing number of resistors and nodes. Accordingly, the run-time taken by a static timing analysis drops. However, at the same time, the stage delay error increases due to the errors introduced by the reduction process. In the case of Step T0 only, the run-time improvement saturates beyond $\tau_{max}=0.1$ ps. In fact, when $\tau_{max}$ increases from 10 ps to 1000ps, there is no additional RC reduction from Step T0. This may be attributed to the order to allow additional elimination of internal nodes (as shown by the last row of the first data section), the run-time increases significantly due to the increased density of the network, as indicated by its increased number of resistors, even though the node count decreased slightly. The data clearly shows that just eliminating internal nodes, as it is practiced in the art, limits the amount of crunching and does not provide the desired smooth tradeoff between analysis speed (measured by run-time of the transistor-level static timing analysis tool) and delay accuracy (measured by the above-chosen stage delay error).

In contrast, when running all the steps from T0 through T6, the algorithm is able to continue providing faster run-times as $\tau_{max}$ increases until a complete crunching is achieved. This happens at $\tau_{max}=1000$ ps, where the total resistor count is reduced to zero. Although the stage delay error at complete crunching is quite significant (as high as about 25 ps), it is clear that the inventive algorithm provides a complete crunching if the user is willing to sacrifice accuracy (indicated by the extremely high value of $\tau_{max}=1000$ ps). Moreover, the analysis speed against accuracy tradeoff is very smooth since with a smaller $\tau_{max}=10$ ps (indicating that the user wants more accuracy), the run-time is close to a complete crunching. However, the stage delay errors are reasonably contained within about 2 ps. It is precisely this smooth tradeoff between analysis run-time and accuracy that makes the inventive RC reduction method so effective and valuable.

The present invention can be realized in hardware, software, or a combination of hardware and software. The present invention can be realized in a centralized fashion in one computer system, or in a distributed fashion where different elements are spread across several interconnected computer systems. Any kind of computer system—or other apparatus adapted for carrying out the methods described herein—is suitable. A typical combination of hardware and software could be a general purpose computer system with a computer program that, when being loaded and executed, controls the computer system such that it carries out the methods described herein. The present invention can also be embedded in a computer program product, which comprises all the features enabling the implementation of the methods described herein, and which—when loaded in a computer system—is able to carry out the method of the present inventiion.

Computer program in the present context is defined as any expression, in any language, code or notation, of a set of instructions intended to cause a system having an information processing capability to perform a particular function either directly or after conversion to another language, code or notation and/or reproduction in a different material form.

It is noted that the foregoing outlined some of the more pertinent objects and embodiments of the present invention. Yet, this invention may be advantageously used for a variety of other applications. Thus, although the description is made for particular arrangements and applications, the intent and concept of the invention is suitable and applicable to other arrangements and applications as well.

It will also be evident to those skilled in the art that other modifications to the disclosed embodiments can be effected without departing from the spirit and scope of the invention. The described embodiments is to be construed to be merely illustrative of some of the more prominent features and applications of the invention. Other beneficial results can be realized by applying the disclosed invention in a different manner or modifying the invention in ways known to those familiar with the art.

What is claimed is:

1. A method for reducing the size of RC parasitics in an interconnect network of an integrated circuit (IC), the IC being formed as a collection of transistors, each having its terminals interconnected by nets, each of the nets being modeled by nodes and elements, the elements being modeled as resistors (R) and capacitors (C), the nodes being attached to transistor terminals are labeled as boundary nodes while the remaining nodes are labeled as internal nodes, the method comprising the steps of:

a) selecting a net from the collection of nets;
   b) reducing the size of the interconnect network of the selected net by eliminating the internal nodes having a time-constant below a predetermined threshold and a fill-in count contained within a pre-specified limit,
   c) iteratively shorting a resistor connected to a boundary node, wherein the accumulated delay error at the boundary node after shorting is less than a fraction of the predetermined threshold;
   d) updating the values of the resistors adjoining the shorted resistor, wherein no additional delay error is generated in the remaining nodes due to shorting the resistor; and
   repeating steps c) and d) until no boundary nodes are found in the selected interconnect network with the accumulated delay errors meeting the predetermined threshold.

2. The method as recited in claim 1, wherein the delay from a source boundary node of the RC network to a sink boundary node is a measure that satisfies an additive property.

3. The method as recited in claim 2, wherein the additive property is defined by the equation:

$$D_B = D_A + R\underline{C}_B$$

wherein R denotes any resistor connected to nodes A and B; $D_A$ and $D_B$ denote respectively the delay from the source boundary node of the RC interconnect network to nodes A and B, and $\underline{C}_B$ denotes the sum of all capacitors downstream from node B.

4. The method as recited in claim 2, wherein the additive property satisfies a requirement that the delay at one end of the resistor be the sum of the delay at the other end of the resistor plus a term which is the product of the value of the resistor multiplied by a sum of capacitors.

5. The method as recited in claim 2, wherein when the delay does not satisfy the additive property, there exists means for computing the delay from the source boundary node of the RC network to a sink boundary node.

6. The method as recited in claim 1 wherein the error introduced by shorting the resistor is minimized by updating the value of adjoining resistors.

7. The method as recited in claim 6, wherein updating the values of the adjoining resistors is given by the equation:

$$\delta_J = R \frac{C_B}{C_J}$$

wherein $\delta_J$ measures the change in value of an adjoining resistor between nodes B and J, R is the resistor being shorted; $C_B$ denotes the sum of all capacitors downstream from node B; and $C_J$ denotes the sum of all capacitors downstream from node J.

8. The method as recited in claim 6, further comprising the step of numerically determining an optimal perturbation to the values of all resistors that are not yet shorted in order to minimize the delay error E is given by the equation:

$$E = |D'_{AB} - D_A| + |D'_{AB} - D_B| + \sum_{X \neq A,B} |D'_X - D_X|$$

wherein, $D_X$ denotes the delay from a source to node X in the RC network before shorting resistor R between nodes A and B, and $D'_X$ denotes the delay from the source to node X in the RC network after shorting R.

9. The method as recited in claim 1 wherein step b) is replaced by an alternative reduction process, and is followed by steps c) and d), thereby accepting a multi-port RC network as an input and generating a new and reduced RC network as output, while preserving all the ports.

10. An article of manufacture comprising a computer usable medium having computer readable program code means embodied therein for reducing the size of RC parasitics in an interconnect network of an integrated circuit (IC), the IC being formed as a collection of transistors, each having its terminals interconnected by nets, each of the nets modeled by nodes and elements, the elements modeled as resistors (R) and capacitors (C), the nodes attached to transistor terminals labeled as boundary nodes while the remaining nodes are labeled as internal nodes, the computer readable program code means in said article of manufacture comprising computer readable program code means for causing a computer to effect the method steps of:

a) selecting a net from the collection of nets;

b) reducing the size of the RC network of the selected net by eliminating the internal nodes having a time-constant below a predetermined threshold and a fill-in count contained within a pre-specified limit;

c) shorting a resistor connected to a boundary node, wherein the accumulated delay error at the boundary node after shorting is less than a fraction of the predetermined threshold;

d) updating the values of the resistors adjoining the shorted resistor, wherein no additional delay error is generated in the remaining nodes due to shorting of the resistor; and repeating steps c) and d) until no boundary nodes are found in the selected RC network meeting the predetermined threshold.

* * * * *